United States Patent [19]

Ramaswami et al.

[11] Patent Number: 5,456,756

[45] Date of Patent: Oct. 10, 1995

[54] HOLDING APPARATUS, A METAL DEPOSITION SYSTEM, AND A WAFER PROCESSING METHOD WHICH PRESERVE TOPOGRAPHICAL MARKS ON A SEMICONDUCTOR WAFER

[75] Inventors: Seshadri Ramaswami, San Jose; Darin A. Chan, Campbell, both of Calif.

[73] Assignee: Advanced Micro Devices, Inc., Sunnyvale, Calif.

[21] Appl. No.: 300,273

[22] Filed: Sep. 2, 1994

[51] Int. Cl.⁶ .................................................. C23C 14/00
[52] U.S. Cl. ..................... 118/721; 118/728; 118/503; 204/298.11; 204/298.15
[58] Field of Search ................................. 118/715, 728, 118/503, 721; 204/298.11, 298.15

[56] References Cited

U.S. PATENT DOCUMENTS

| | | | |
|---|---|---|---|
| 4,470,975 | 9/1984 | Poteat | 156/644 |
| 4,592,308 | 6/1986 | Shih | 118/728 |
| 4,599,970 | 7/1986 | Peterson | 118/728 |
| 4,944,836 | 7/1990 | Beyer et al. | 156/645 |

*Primary Examiner*—Richard Bueker
*Attorney, Agent, or Firm*—Raymond Kam-On Kwong

[57] ABSTRACT

A holding apparatus, a metal deposition system and a wafer processing method which preserve topographical marks, including those used as alignment targets, on a semiconductor wafer by preventing metal from depositing on such marks during metal deposition. The invention eliminates the need to use window mask and etch techniques to provide replication of topographical marks on a newly formed metal layer when a CMP planarization technique is used prior to metal deposition. As a result, cost, cycle time and yield loss due to the additional window mask and etch steps can be eliminated. The holding apparatus includes a wafer retainer for retaining a wafer which has at least one topographical mark and a clamp ring with at least one tab. The wafer is pressed against the clamp ring by the retainer for securing the wafer in the retainer. Each tab is positioned directly above a corresponding one of the topographical mark and has an area big enough to cover such mark for avoiding metal being deposited on such mark during metal deposition of the wafer. The metal deposition system comprises a depositing system for depositing a layer of a selected metal onto the wafer. The metal deposition system also includes a holding apparatus constructed in accordance with the present invention for holding the wafer during metal deposition. The processing method comprises forming an optically transparent oxide layer over the wafer which includes at least one topographical mark and providing a metallized layer over the wafer except over such mark.

18 Claims, 10 Drawing Sheets

HOLDING APPARATUS, A METAL DEPOSITION SYSTEM, AND A WAFER PROCESSING METHOD WHICH PRESERVE TOPOGRAPHICAL MARKS ON A SEMICONDUCTOR WAFER

FIELD OF THE INVENTION

The invention is generally related to metal deposition of semiconductor wafers and more specifically to a holding apparatus, a metal deposition system and a wafer processing method that preserve topographical marks, including those that are used as alignment targets, on the wafers by preventing metal from depositing on such marks during metal deposition of the wafers.

BACKGROUND OF THE INVENTION

The fabrication of microcircuit devices on a semiconductor wafer involves a number of steps where patterns are transferred from photolithographic masks onto the wafer. The masking step includes an etching step and defines selected areas to be exposed on the wafer for subsequent processes such as oxidation, metal deposition, and impurity introduction.

In the production of integrated circuit structures, it has become increasingly important to provide structures having a plurality of metallization layers due to the ever increasing density of the circuit elements in the structure. Further, as the device and feature sizes becoming smaller, it is important that the photolithographic mask be aligned precisely with the wafer during the masking step to minimize the misalignment between layers. Most alignment schemes require the use of alignment targets that were defined on the wafers in the previous layer. One such scheme involves the use of two alignment targets that were defined on the wafers with all subsequent layers being aligned with respect to these two alignment targets. Typically, each alignment target comprises topographical marks which can be formed by etching into the wafer a plurality of steps with a height of, for example, 1000 angstrom, and a width and a spacing between each step of, for example, 10 µm. The alignment targets are used to diffract a laser alignment beam generated by a photolithography machine, commonly known as a wafer stepper, during the masking process. The diffraction pattern is received by the wafer stepper and the relative position of the wafer and the photolithographic mask is adjusted accordingly so that the patterns from the photolithographic mask are transferred to the wafer in the precise location as desired.

During the fabrication of the integrated circuit structures, a number of metallization layers are formed. Each of the metallization layers is typically separated from another metallization layer by an insulation layer, such as an oxide layer. In order to minimize the misalignment between layers, it is important that the topography of these alignment targets be replicated from one layer to the next, since the locations of the resulting patterns on each layer are formed based on the precise registration between the photolithographic mask and the alignment targets on the previous layer.

To provide an overlying metallization layer without discontinuities or other flaws, it is desirous to provide an underlying surface for the metallization layer that is as flat or planar as possible. It has, therefore, become the practice to smooth the surface of a layer in preparation for a subsequently applied metallization layer by a process of planarization.

Conventional planarization techniques, such as plasma etching or Reactive Ion Etching (RIE) of oxides with a resist planarizing medium, are used to provide a smooth surface and a local planarization with a range of typically less than 1 µm. Smoothing is achieved over a greater range, but the step topography of the alignment targets is preserved since its step spacing is much greater than the planarization range.

However, to meet the demand for more metal and insulating layers in devices and the stringent depth of focus requirement for submicron lithography, a new planarization technique, commonly known as chemical-mechanical polishing (CMP), is used. U.S. Pat. No. 4,944,836, entitled "Chem-Mech Polishing Method For Producing Coplanar Metal/Insulator film On A Substrate" (issued Jul. 31, 1990, to Beyer et al. and assigned to International Business Machines Corporation) discloses one such CMP technique. Typically, CMP planarization of a wafer involves holding the wafer against a rotating polishing pad wet with a silica-based alkaline slurry and at the same time applying pressure. Unlike the conventional planarization techniques, the CMP planarization technique provides a global planarization, that is, one that provides a large planarization range that generally covers the whole wafer surface. Since the planarization range is large, the alignment targets on a newly formed layer on the wafer will lose its steps after it is planarized by the CMP technique and thus fails to replicate the alignment targets on the previous layer that was beneath the newly formed layer. This is acceptable as long as the planarized newly formed layer is transparent, such as in the case of an oxide, since the laser alignment beam from a wafer stepper and the corresponding diffraction pattern can pass through such transparent layer. However, when the planarized newly formed layer is highly reflective or opaque, such as in the case of a metal, the alignment targets will not be visible to the wafer stepper. In that case, new alignment targets have to be formed on the newly formed layer using a process commonly known as a "window mask" process.

Performed after CMP planarization and before contact masking, a window mask process is a process in which only the alignment targets are exposed, while the rest of the wafer surface is covered by photoresist. The wafer is then subject to an oxide etch of sufficient duration so that the amount of oxide removed during this etch, plus the amount of oxide to be removed during subsequent contact etch, will expose the step patterns of the underlying alignment targets. Thus, when metal is deposited, it replicates the topography of the step patterns of the underlying alignment targets, forming a new set of alignment targets. Accordingly, the wafer stepper can now perform alignment between a photolithographic mask and the wafer in the next photolithographic process.

However, the additional window mask and etch steps, plus their attendant cleanings and inspections, undesirably increase cycle time and process complexity and also introduce particles and defects, resulting in an increase in cost and yield loss. Hence, there is a need to provide an apparatus, a metal deposition system and a method for use in semiconductor fabrication process that utilize CMP planarization prior to metal deposition, while at the same time eliminating the window mask and etch steps. The present invention addresses such a need.

SUMMARY OF THE INVENTION

One aspect of the invention is to provide an apparatus, for use with a semiconductor wafer during metal deposition, which preserves the topographical marks of the wafer when a CMP planarization technique is used prior to the metal deposition.

Another aspect of the invention is to provide an apparatus, for use with a semiconductor wafer during metal deposition, which preserves the alignment targets of the wafer when a CMP planarization technique is used prior to the metal deposition.

A further aspect of the invention is to provide an apparatus, for use with a semiconductor wafer during metal deposition, which eliminate the need to use window mask and etch steps to provide replication of the alignment targets on a newly formed metal layer when a CMP planarization technique is used prior to the metal deposition.

Another aspect of the invention is to provide an apparatus, for use with a semiconductor wafer during metal deposition, which minimizes cost, cycle time and yield loss by preserving alignment targets of the wafer when a CMP planarization technique is used prior to the metal deposition.

Yet Another aspect of the invention is to provide a metal deposition system for use with the fabrication of semiconductor wafers, which preserves the topographical marks of the wafers when a CMP planarization technique is used prior to metal deposition.

Another aspect of the invention is to provide a metal deposition system for use with the fabrication of semiconductor wafers, which preserves the alignment targets of the wafers when a CMP planarization technique is used prior to metal deposition.

A further aspect of the invention is to provide a metal deposition system, for use with the fabrication of semiconductor wafers, which eliminates the need to use window mask and etch steps to provide replication of the alignment targets on a newly formed metal layer when a CMP planarization technique is used prior to metal deposition.

Yet another aspect of the invention is to provide a metal deposition system, for use with the fabrication of semiconductor wafers, which minimizes cost, cycle time and yield loss by preserving alignment targets of the wafers when a CMP planarization technique is used prior to metal deposition.

Another aspect of the invention is to provide a method for processing a wafer with at least one topographical mark which preserves the topographical mark of the wafer when a CMP planarization technique is used prior to metal deposition.

A further aspect of the invention is to provide a method for processing a wafer with alignment targets which preserves the alignment targets of the wafers when a CMP planarization technique is used prior to metal deposition.

Still another aspect of the invention is to provide a method for processing a wafer with alignment targets which eliminates the need to use window mask and etch steps to provide replication of the alignment targets on a newly formed metal layer when a CMP planarization technique is used prior to the metal deposition.

A further aspect of the invention is to provide a method for processing a wafer with alignment targets, which minimizes cost, cycle time and yield loss by preserving the alignment targets of the wafers when a CMP planarization technique is used prior to metal deposition.

Additional aspects, advantages and novel features of the invention will be set forth in part in the description which follows, and in part will become apparent to those skilled in the art upon examination of the following or may be learned by practice of the invention. The aspects and advantages of the invention may be realized and attained by means of the instrumentalities and combinations particularly pointed out in the appended claims.

In accordance with these aims and aspects, the present invention is concerned with the provision of an apparatus for holding a semiconductor wafer having at least one topographical mark during metal deposition thereon. The holding apparatus comprises a wafer retainer for retaining the wafer and a clamp ring with at least one tab. The clamp ring and the retainer are constructed for securing the wafer against the clamp ring by the retainer. Each one of said at least one tab on said clamp ring is positioned to be located directly above a corresponding one of the at least one topographical mark. Each one of said at least one tab has an area big enough to cover each of the corresponding one of the at least one topographical mark for avoiding metal being deposited on the at least one topographical mark during metal deposition of the wafer.

The present invention is also concerned with the provision of a metal deposition system for use in depositing a selected metal onto a semiconductor wafer that includes at least one topographical mark. The metal deposition system comprises a depositing means for depositing a layer of the selected metal onto the wafer and a holding apparatus for holding the wafer during said metal deposition. The holding apparatus comprises a wafer retainer for retaining the wafer and a clamp ring with at least one tab. The clamp ring and the retainer are constructed for securing the wafer against the clamp ring by the retainer. Each one of said at least one tab on said clamp ring is positioned to be located directly above a corresponding one of the at least one topographical mark. Each one of said at least one tab has an area big enough to cover each of the corresponding one of the at least one topographical mark for avoiding metal being deposited on the at least one topographical mark during metal deposition of the wafer.

The present invention is also concerned with providing a method for processing a wafer which has at least one topographical mark. The method includes providing the wafer having the at least one topographical mark, forming an optically transparent oxide layer over the wafer including the at least one topographical mark, and providing a metallized layer over the wafer except over the at least one topographical mark.

By using the holding apparatus, the metal deposition system, or the processing method of the present invention, metal depositions on any topographical marks, including those used as alignment targets, of a semiconductor wafer can be avoided during the metal deposition of the wafer. Accordingly, the topographical marks of the wafer are preserved. As a result, it eliminates the need to use window mask and etch steps to provide replication of alignment targets on a newly formed metal layer when a CMP planarization technique is used prior to the metal deposition. Consequently, manufacturing cost, cycle times and yield loss can be mininized.

Still other aspects and advantages of the present invention will become readily apparent to those skilled in this art from the following detailed description, wherein only the preferred embodiments of the invention have been shown and described, simply by way of illustration of the best mode contemplated by the inventors of carrying out the invention. As will be realized, the invention is capable of other and different embodiments, and its several details are capable of modifications in various obvious respects, all without departing from the invention. Accordingly, the drawings and descriptions are to be regarded as illustrative in nature, and not as restrictive.

BRIEF DESCRIPTION OF THE DRAWINGS

It will be appreciated that these drawings are for the purposes of illustration, and are therefore not necessarily drawn to scale.

DETAILED DESCRIPTION OF THE PREFERRED EMBODIMENTS

The following detailed description is of the best modes presently contemplated by the inventors for practicing the invention. It should be understood that the descriptions of these preferred embodiments are merely illustrative and that they should not be taken in a limiting sense.

Figure 1A:
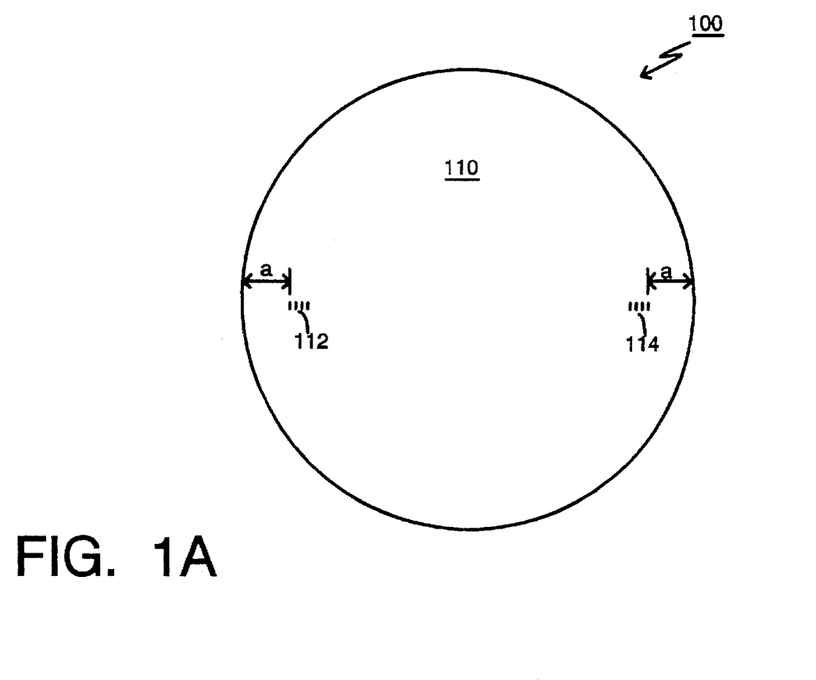
FIG. 1A is a top view of a typical semiconductor wafer showing the alignment targets and their respective locations on the wafer.

Referring to FIG. 1A, there is shown a typical semiconductor wafer 100, with a surface 110. Two first alignment targets, 112 and 114, are along the center line of the wafer 100, with alignment target 112 on the left and alignment target 114 on the right with respect to the center of the wafer 100. For a 6 inch wafer, alignment targets 112 and 114 are typically at a distance (a) of about 0.4 to 0.8 inch from the respective edge of the wafer 100.

Figure 1B:
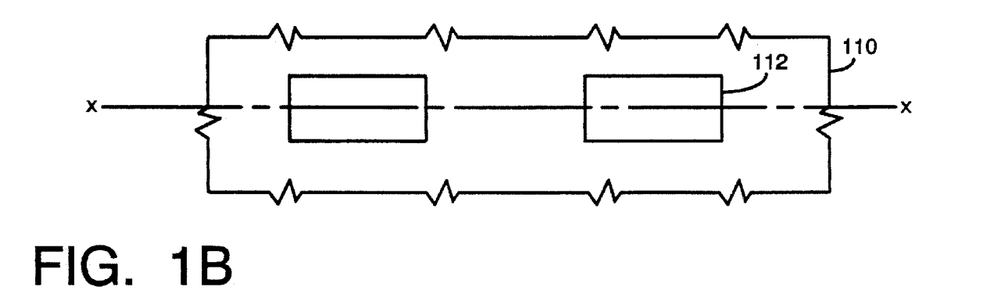
FIG. 1B is a magnified top view of a portion of one of the alignment targets shown in FIG. 1A.

FIG. 1B illustrates a magnified, top view of first alignment target 112. First alignment target 112 includes a number of steps. Line X—X is the center line of the alignment target 112.

Figure 1C:
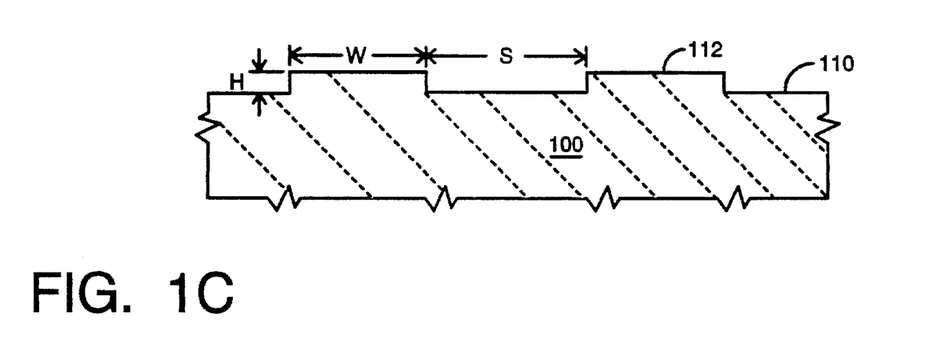
FIG. 1C is a cross-sectional view of the portion of the alignment target shown in FIG. 1B.

FIG. 1C is a cross-sectional view along line X—X of FIG. 1B. The height (H), width (W) and spacing (S) of the steps in the first alignment target 112 are typically 1000 angstrom, 10 µm and 10 µm respectively. The steps of the first alignment target 112 are used to diffract a laser alignment beam generated by a wafer stepper during the masking step in the photolithography process. The diffracted pattern received by the wafer stepper will direct it to make the accurate alignment between the mask and the wafer 100 so that the patterns from the mask are transferred to the wafer 100 in the precise location as desired.

Figure 2A:
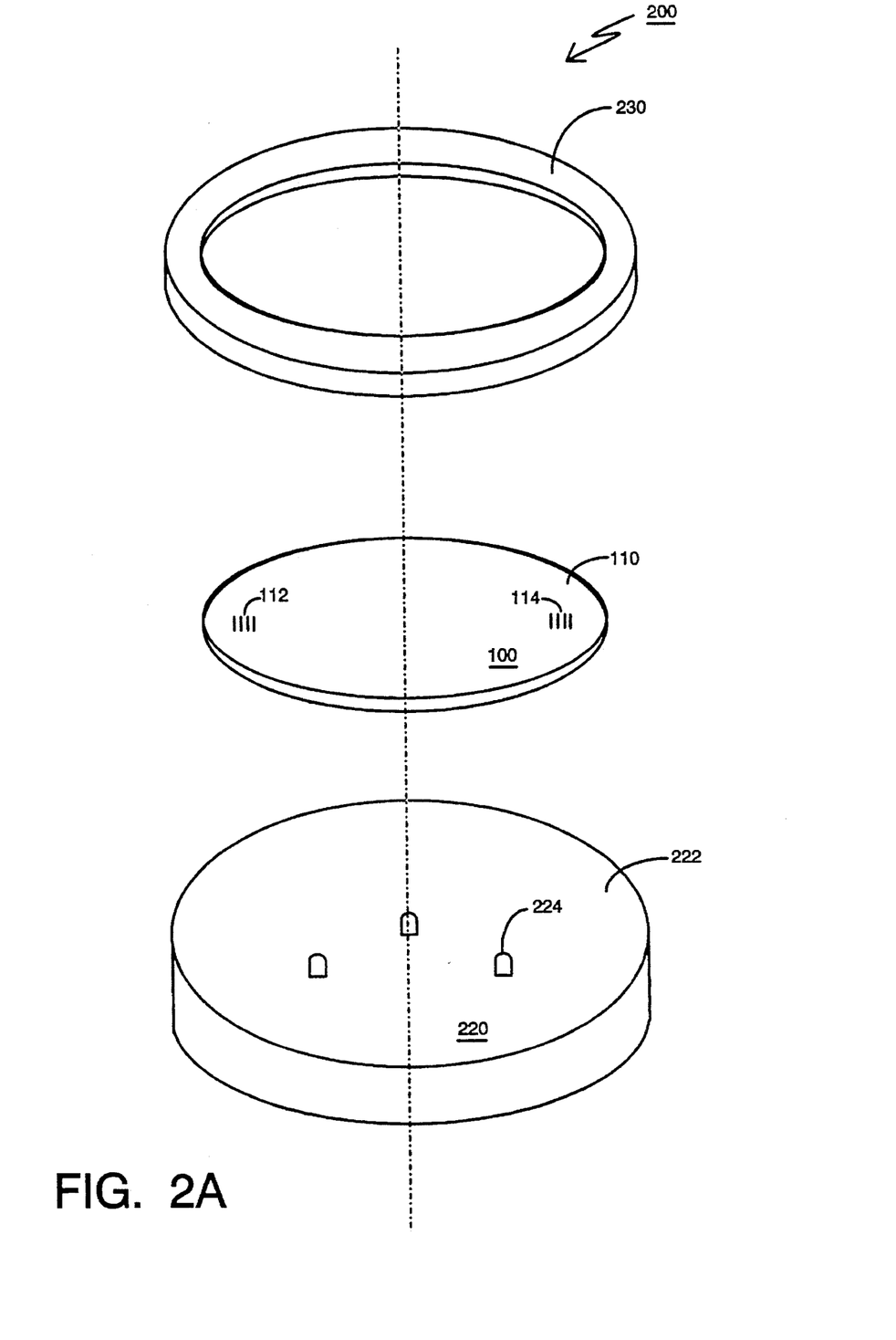
FIG. 2A is a conventional apparatus for holding a wafer in a metal deposition system.
Figure 2B:
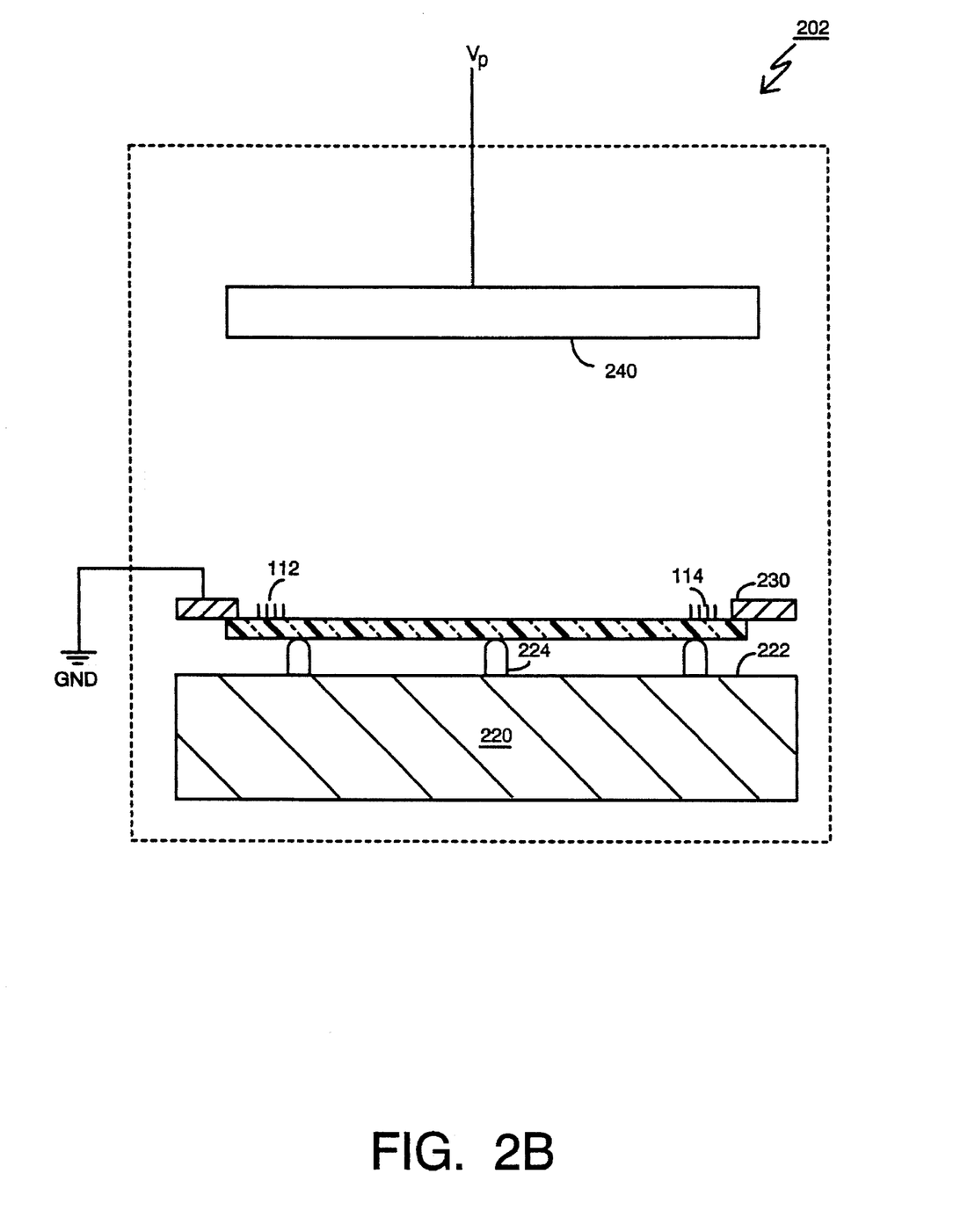
FIG. 2B is a cross-sectional view of the conventional holding apparatus as shown in FIG. 2A, with a further illustration of a target used in the metal deposition system.

Referring now to FIGS. 2A–B, which illustrate a conventional apparatus 200 for holding a wafer 100 in a metal deposition system 202. In this embodiment, the metal deposition system 202 uses a sputtering technique for metal deposition. Sputtering, when used as a method of metal deposition, is commonly known as physical vapor deposition (PVD) and is well known in the art. It involves enclosing the wafer 100 to be sputtered in a chamber filled with a gas at low pressure, such as argon. Argon bombards and dislodges atoms from a target of the material to be deposited on the wafer 100.

Just as what is shown on FIG. 1A, wafer 100 in FIG. 2A includes a surface 110 and two alignment targets 112 and 114. The conventional holding apparatus 200 comprises a wafer retainer 220, which includes a surface 222 and three protrusions 224. The protrusions 224 are used to support the backside of the wafer 100. The wafer retainer 220 can be moved up and down for loading and unloading of the wafer 100. The conventional holding apparatus 200 also includes a conventional clamp ring 230, typically made of titanium. The clamp ring 230 is typically secured to some fixtures on the metal deposition system 202.

FIG. 2B is a cross-sectional view of the conventional holding apparatus 200 as shown in FIG. 2A, with a further illustration of a target used in the metal deposition system 202. Wafer 100 is supported by protrusions 224 of the wafer retainer 220. After the wafer 100 is loaded onto the wafer retainer 220, the wafer retainer 220 will move up and press the wafer against the clamp ring 230 for securing the wafer 100. Target 240 comprises the selected metal to be deposited on the wafer 100. Target 240 is typically coupled to a high voltage potential, $V_P$.

In operation, low pressure gas, for example argon, is allowed to bombard the target and atoms removed from the target will be deposited onto the wafer 100.

Figure 3A:
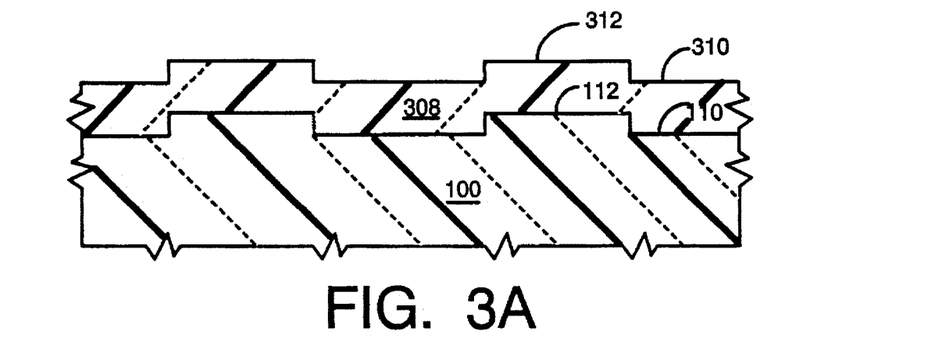
FIGS. 3A–C are cross-sectional views of the sequence of processing steps illustrating the replication of alignment targets by metal deposition after oxidation and a conventional planarization step.

Referring now to FIG. 3A, there is shown a cross-sectional view along line X—X of the first alignment target 112, formed on wafer 100, as illustrated in FIG. 1B. A conformal layer of insulation material 308 is deposited on the surface 110 of wafer 100. In this embodiment, the insulation material 308 is an oxide, which can be formed on wafer 100 using chemical vapor deposition. The oxide layer 308 includes a surface 310 and replicates the topography of the first alignment target 112 to form second alignment target 312.

Figure 3B:
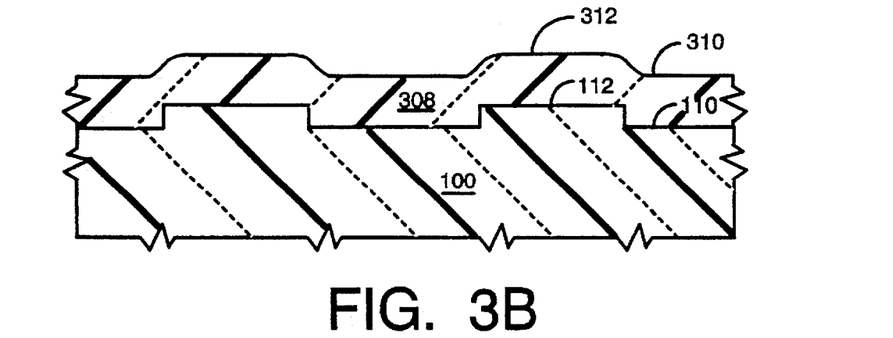

After deposition of oxide layer 308, a conventional planarization technique, such as plasma etching or Reactive Ion Etching (RIE) of oxides with a resist planarizing medium, is applied to the surface 310 of the wafer 100 to provide a smooth surface and a local planarization with a range of typically less than 1 µm, as shown in FIG. 3B. Smoothing is achieved over a greater range. The steps of the second alignment targets now have smooth and sloped, instead of vertical, edges. Therefore, the step topography of the second alignment target is preserved because its step spacing, typically 10 μm, is much greater than the planarization range.

Figure 3C:
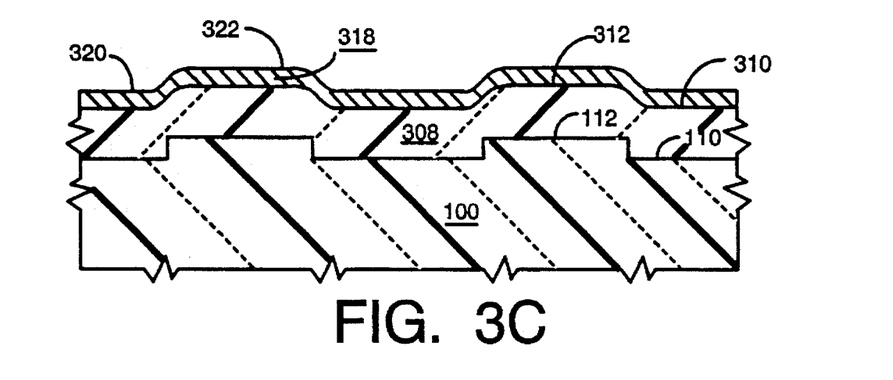

As shown in FIG. 3C, after the conventional planarization, a layer of metal is deposited over oxide layer 310 of wafer 100 using conventional metal deposition techniques, such as evaporation or sputtering. The oxide layer 318 includes a surface 320 and replicates the topography of the second alignment target 312 to form a third alignment target 322. The third alignment target 322 can be used as the alignment target for the next photolithographic process.

Figure 4A:
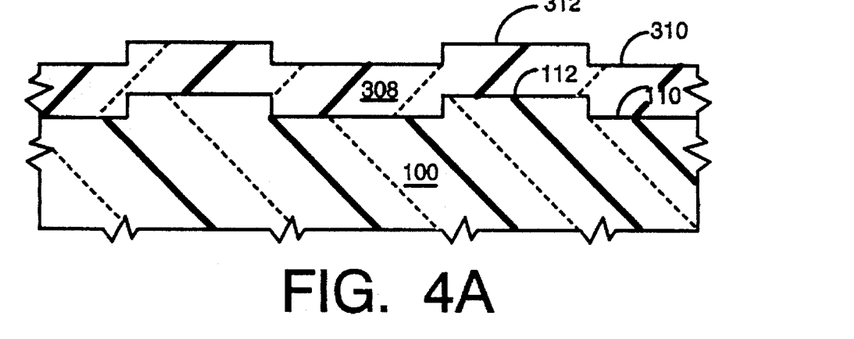
FIGS. 4A–C are cross-sectional views of the sequence of processing steps illustrating the loss of alignment targets when metal is deposited after oxidation and CMP planarization steps.
Figure 4B:
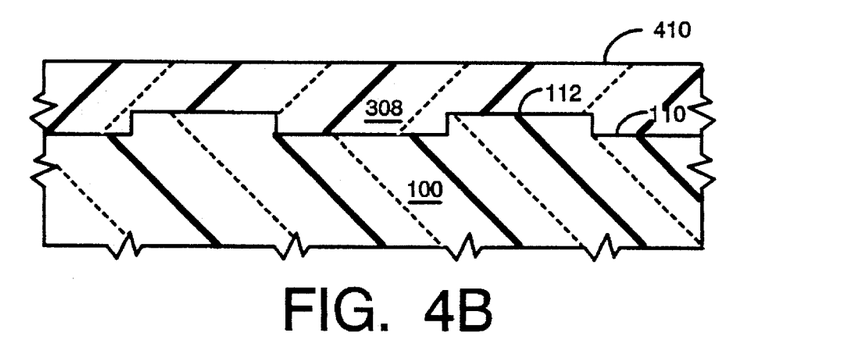
Figure 4C:
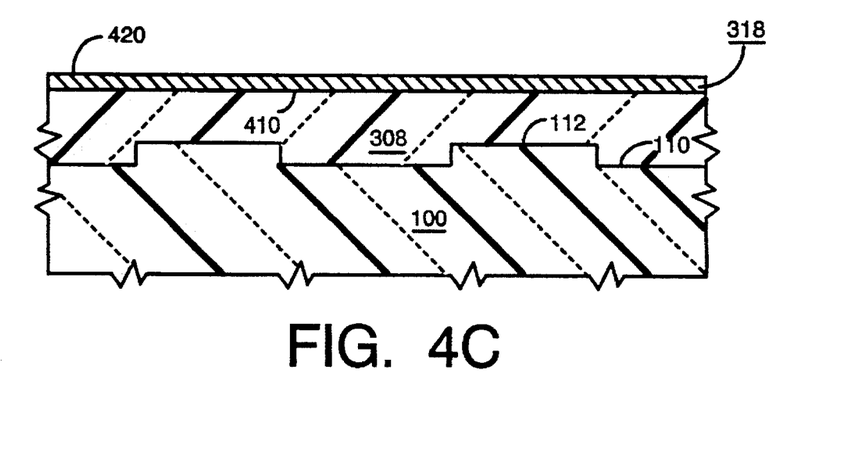

As mentioned earlier, global plananzation, which can be achieved with CMP technique, is required in VLSI devices due to the increase in the number of metal and insulation layers as well as the stringent depth of field requirement in submicron lithography. FIGS. 4A–C illustrates the inability of the conventional oxidation-metal deposition process to retain alignment targets.

Referring now to FIG. 4A, there is shown a cross-sectional view along line X—X of the first alignment target 112, formed on wafer 100, with a conformal layer of oxide 308 on the surface 110 of wafer 100. The second alignment target 312 is formed by replicating the topography of first alignment target 112. FIG. 4A is identical to what is shown in FIG. 3A.

As shown in FIG. 4B, after deposition of oxide layer 308, a CMP is applied to the surface 310 of the wafer 100 to provide global planarization with a very large range that generally covers the whole wafer surface. The global planarization removes all the steps of the second alignment target 312, leaving a new, planar surface 410 on top of oxide layer 308.

Next, a layer of metal 318 is deposited over the surface 410 of oxide layer 308 of wafer 100 using conventional metal deposition techniques, as shown in FIG. 4C. The surface 420 of metal layer 318 replicates surfs 410 of oxide layer 308 to form a planar surface. Therefore, there is no alignment target on the surface 420 of the metal layer 318. Further, since metal layer 318 is highly reflective, the alignment target 112 on surface 110 of the wafer 100 is not visible to the wafer stepper. As a result, additional steps, such as the window mask process, have to be used to provide alignment targets.

Figure 5A:
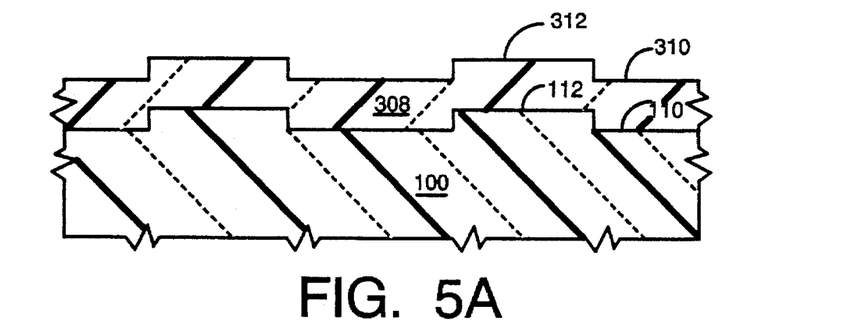
FIGS. 5A–D are cross-sectional views of the sequence of processing steps illustrating the use of a window mask process to provide alignment targets by etching after the oxide layer before metal deposition when a CMP planarization step is used.

FIGS. 5A–D illustrate the window mask process. FIG. 5A shows a cross-sectional view along line X—X of the first alignment target 112, formed on wafer 100, with a conformal layer of oxide 308 on the surface 110 of wafer 100. FIG. 5A is identical to what is shown in FIG. 4A.

Figure 5B:
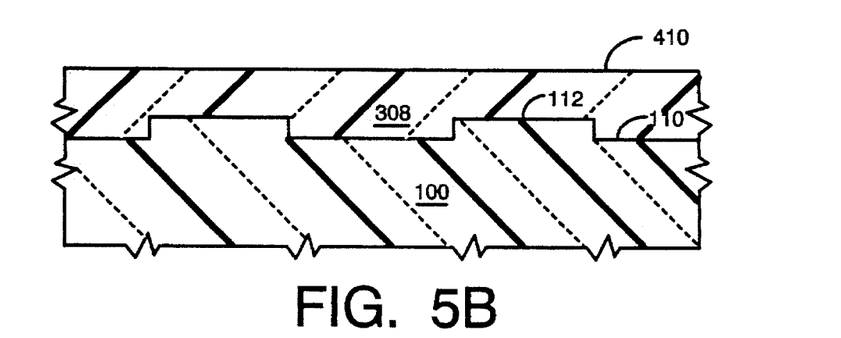

FIG. 5B shows the removal of all the steps of second alignment target 312 after CMP. FIG. 5B is identical to what is shown in FIG. 4B.

Figure 5C:
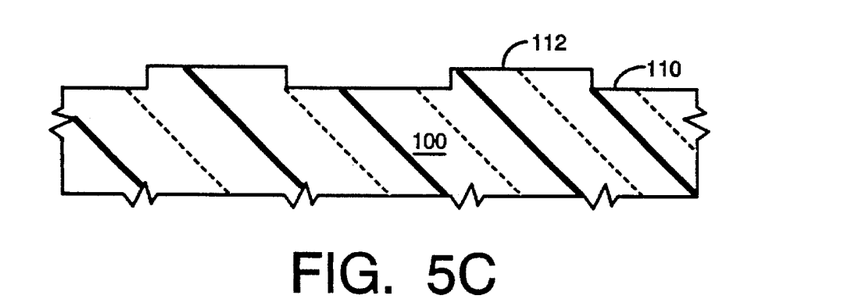

A window mask process is a process that is performed after CMP planarization and before contact masking. In the window mask process, only the first alignment targets, 112 and 114, are exposed, while the rest of the wafer surface is covered by photoresist. The wafer is then subject to an oxide etch of sufficient duration so that the amount of oxide removed during this etch, plus the mount of oxide to be removed during subsequent contact etches, will expose the step patterns of the underlying first alignment targets 112 and 114. FIG. 5C shows first alignment target 112 on surface 110 of wafer 100 after oxide etch.

Figure 5D:
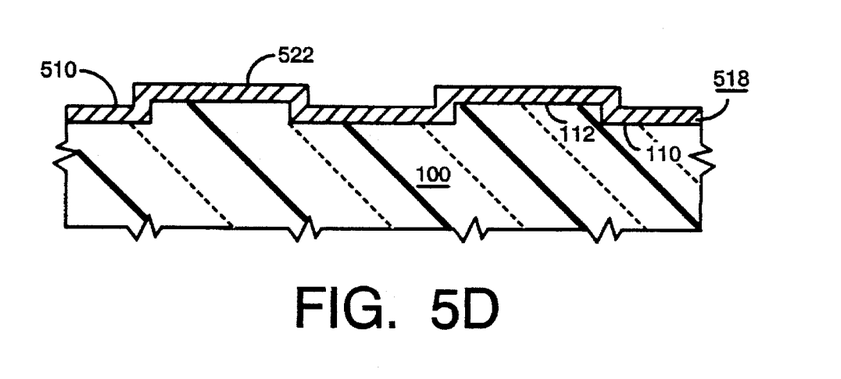

Next, a layer of metal 518 is deposited on wafer 100, which is illustrated in FIG. 5D. The metal layer 518 includes surface 520 and second alignment target 522 that replicates the topography of alignment target 112. Accordingly, the wafer stepper can perform alignment between the photolithographic mask and the wafer in the next photolithographic process using the second alignment target 522.

However, the additional window mask and etch steps, plus their attendant cleanings and inspections, undesirably increase cycle time and process complexity and also introduce particles and defects, resulting in an increase in cost and yield loss. The present invention preserves alignment targets of the wafer when a CMP planarization technique is used prior to the metal deposition and thus eliminates the need for window mask and etch steps.

Figure 6:
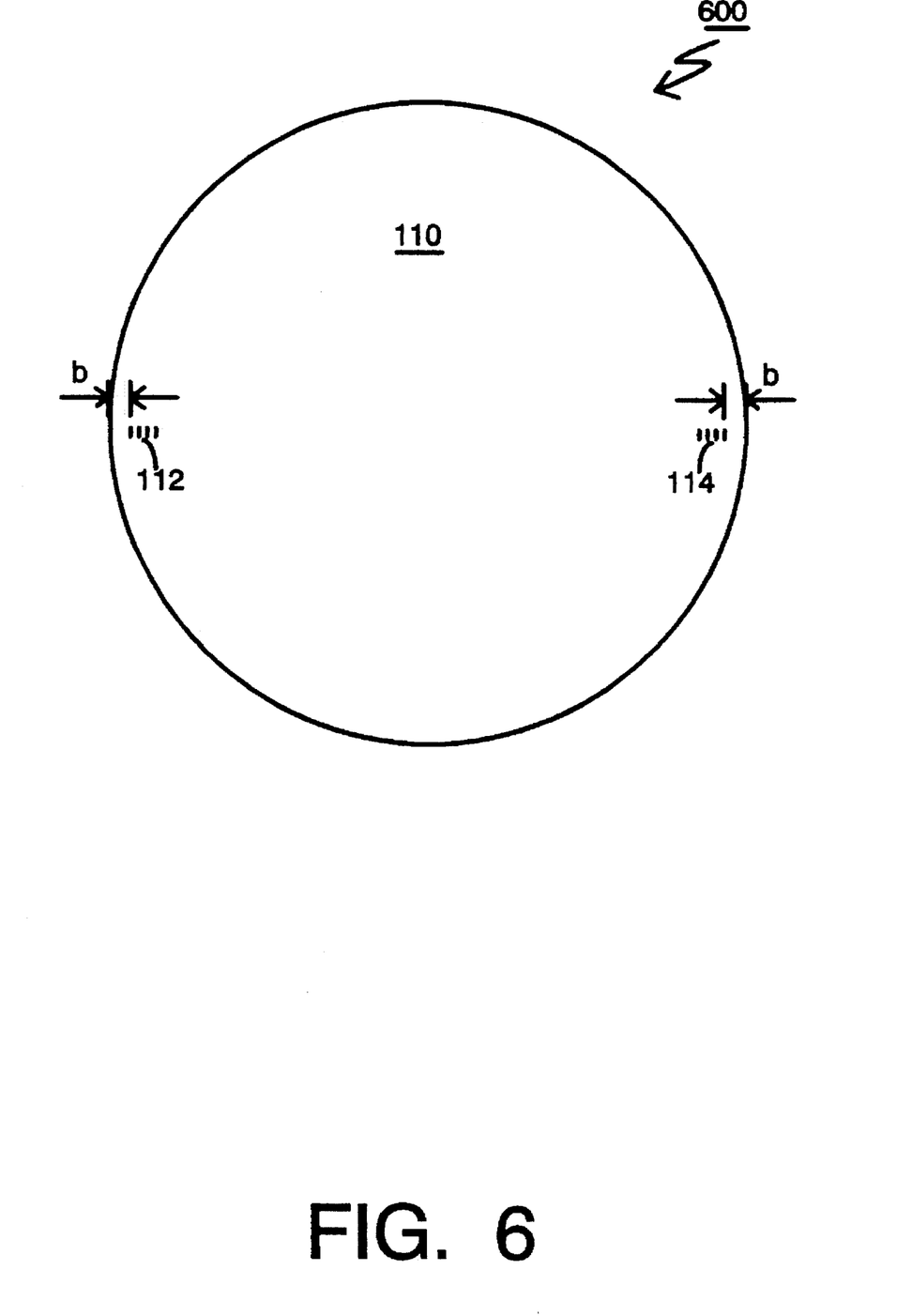
FIG. 6 is a top view of a semiconductor wafer showing the alignment targets and their respective locations on the wafer, constructed in accordance with the present invention.

Referring to FIG. 6, there is shown a semiconductor wafer 600, with a surface 110, and two first alignment targets, 112 and 114, constructed in accordance with the present invention. First alignment targets 112 and 114 are also located along the center line of the wafer 100 and are constructed identically to what is shown in FIG 1B and 1C. However, unlike the typical semiconductor wafer 100 as shown in FIG. 1A, wafer 600 has the two first alignment targets 112 and 114 located in proximity to the edges of the wafer 600. The location of the first alignment targets 112 and 114 are such that tabs on the clamp ring of a wafer holding apparatus that retain the wafer can be used to cover them entirely to prevent metal deposition and at the same time, minimize obstruction to metal deposition on other areas on the surface 110 of the wafer 600. In this embodiment, a 6 inch wafer was used and alignment targets 112 and 114 are located at a distance (b) of about 0.28 inch from the respective edge of the wafer 600.

Figure 7A:
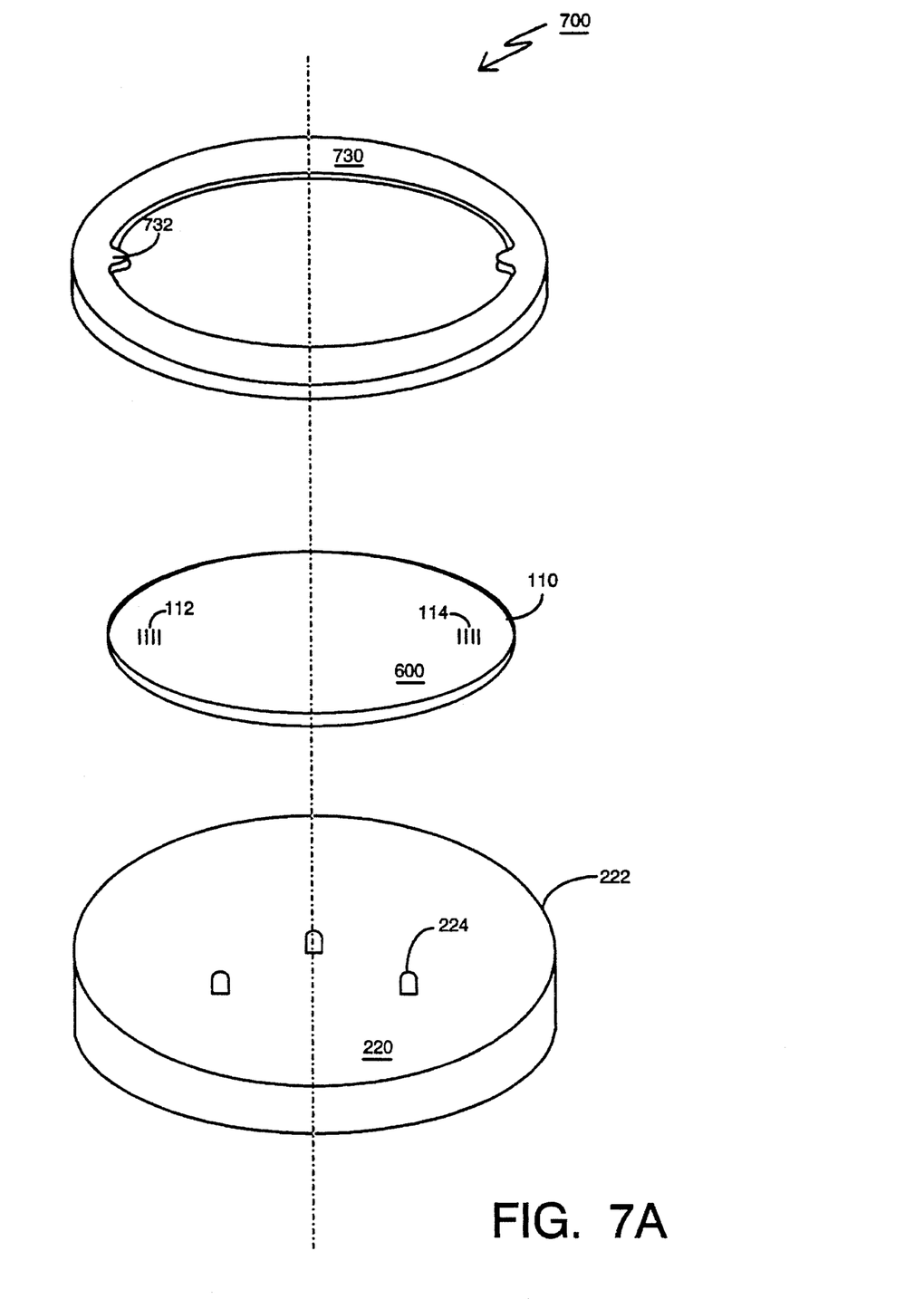
FIG. 7A illustrates an apparatus for holding a wafer, constructed in accordance with the present invention, for use in a metal deposition system.
Figure 7B:
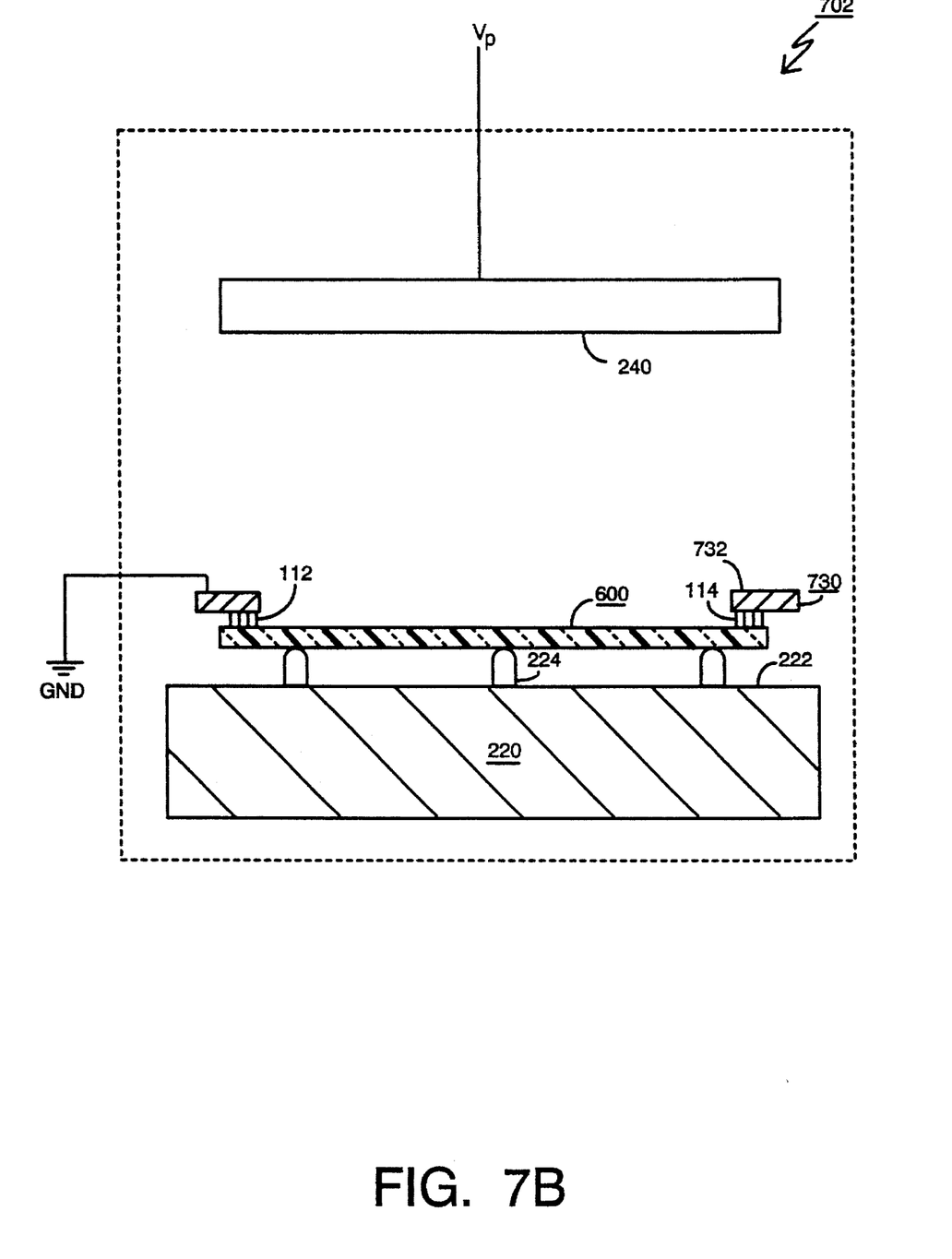
FIG. 7B is a cross-sectional view of the holding apparatus as shown in FIG. 7A, with a further illustration of a target used in the metal deposition system.

Referring now to FIGS. 7A–B, which illustrate an apparatus 700 for holding the wafer 600 in a metal deposition system 702. In this embodiment, for the purpose of explanation, the metal deposition system 702 also uses a sputtering technique for metal deposition.

Just as what is shown on FIG. 1A, wafer 600 in FIG. 7A includes a surface 110 and two alignment targets 112 and 114. To utilize the present invention, however, the first alignment targets 112 and 114 are now located along the center line of and in proximity to the edges of the wafer 600.

The holding apparatus 700 comprises a wafer retainer 220, which includes a surface 222 and three protrusions 224. Again, the wafer retainer 220 can be moved up and down for loading and unloading of the wafer 100. The holding apparatus 700 also includes a clamp ring 730, typically made of titanium. The clamp ring 730 is typically secured to some fixtures on the metal deposition system 702. The clamp ring 730 includes two tabs 732 which are of the size such that when they are directly above the alignment targets 112 and 114, they will cover the alignment targets 112 and 114 completely.

FIG. 7B is a cross-sectional view of the holding apparatus 700 as shown in FIG. 7A, with a further illustration of a target 240 used in the metal deposition system 702. Wafer 600 is supported by protrusions 224 of the wafer retainer 220. After the wafer 600 is loaded onto the wafer retainer 220, the wafer retainer 220 will move up and press the wafer against the clamp ring 730 for securing the wafer 600. Clamp ring 730 and the wafer 600 are aligned in such a way that the tabs 732 are directly above the alignment targets 112 and 114, so that the alignment targets 112 and 114 are covered completely by tabs 732. Again, target 240 comprises the selected metal to be deposited on the wafer 100. Similarly, target 240 is typically coupled to a high voltage potential, $V_P$.

In operation, low pressure gas, for example, argon is allowed to bombard the target and atoms removed from the target will be deposited onto the wafer 600. Since the alignment targets 112 and 114 are completely covered by tabs 732, there is no metal deposited on the alignment targets 112 and 114. As a result, the alignment targets underneath a previous deposited oxide layer will remain to be visible to a wafer stepper. As will be explained later, this eliminates the window mask and etch steps associated with a conventional holding apparatus.

Figure 8A:
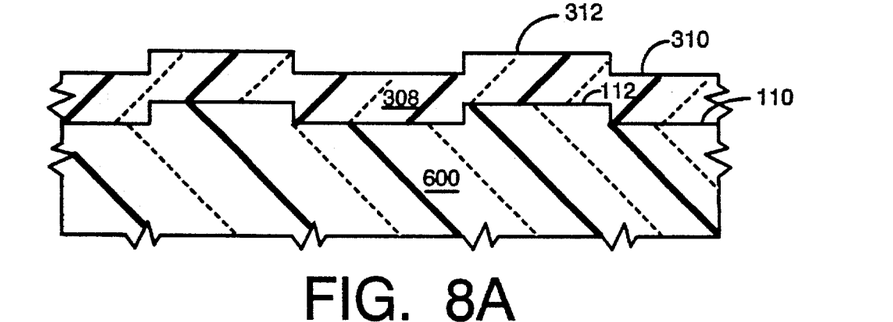
FIGS. 8A–C are cross-sectional views of the sequence of processing steps illustrating the use of a holding apparatus constructed in accordance with the present invention to preserve alignment targets when a CMP planarization step is used, by completely covering the alignment targets during metal deposition.
Figure 8B:
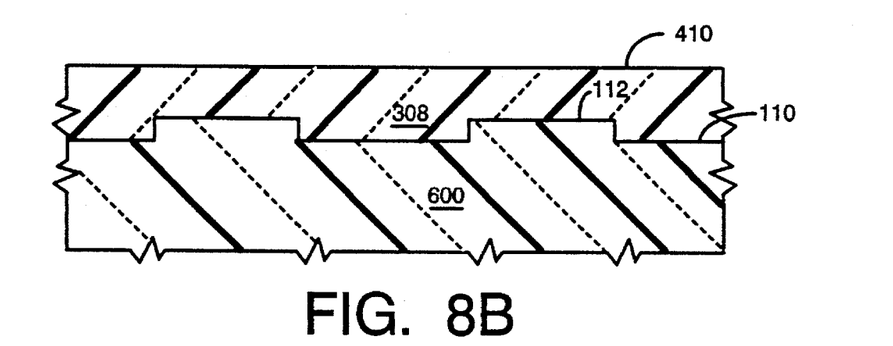
Figure 8C:
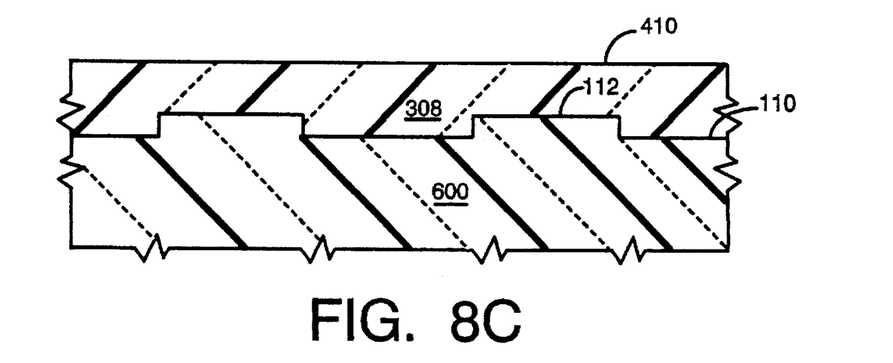

FIGS. 8A–C illustrate the oxidation and metal deposition process on wafer 600 as shown in FIG. 6 using a holding apparatus constructed in accordance with the present invention.

Referring now to FIG. 8A, there is shown a cross-sectional view along line X—X of the first alignment target 112, formed on wafer 600, with a conformal layer of oxide 308 on the surface 110 of wafer 600. Second alignment targets 312 are formed on the surface 310 of the oxide layer 308 by replicating the topography of first alignment targets 112. FIG. 8A is identical to what is shown in FIG. 3A, except that wafer 600, instead of wafer 100, is provided.

As shown in FIG. 8B, after deposition of oxide layer 308, a CMP is applied to the surface 310 of the wafer 600 to provide global planarization with a very large range that generally covers the whole wafer surface. As before, the global planarization removes all the steps of second alignment target 312, leaving a new, planar surface 410 on top of oxide layer 308.

After oxidation, wafer 600 is subject to metal deposition. By using the holding apparatus constructed in accordance with the present invention during metal deposition, metal deposition on top of the alignment targets is avoided. Since oxide layer 308 is transparent, first alignment target 112 is visible to a wafer stepper and therefore can be used by the wafer stepper to align the photolithographic mask and the wafer 600 in the next photolithographic process.

Accordingly, by using the holding apparatus, the metal deposition system, or the processing method of the present invention, metal deposition on the alignment targets of a semiconductor wafer are avoided during the metal deposition of the wafer. Accordingly, the alignment targets of the wafer are preserved. As a result, it eliminates the need to use window mask and etch steps to provide replication of alignment targets on a newly formed metal layer when a CMP planarization technique is used prior to the metal deposition. Consequently, manufacturing cost, cycle times and yield loss can be minimized.

The above described embodiments are merely illustrative of the present invention. Various alternate designs will become apparent to those skilled in the art after reading the above disclosure. For example, the present invention may be applied to preserve any topographical marks, such as those used as bar codes on a wafer, during metal deposition. It is to be understood that the scope of the invention is not limited merely to the above described embodiments.

What is claimed is:

1. An apparatus for holding a semiconductor wafer during metal deposition thereon, the wafer having at least one topographical mark, comprising:

a wafer retainer for retaining the wafer; and a clamp ring having at least one tab, said clamp ring and said retainer being constructed for securing the wafer against said clamp ring by said retainer, each one of said at least one tab on said clamp ring being positioned to be located directly above a corresponding one of the at least one topographical mark and having an area big enough to cover each of the corresponding one of the at least one topographical mark for avoiding metal being deposited on each one of the at least one topographical mark during metal deposition of the wafer.

2. An apparatus for holding a semiconductor wafer during metal deposition thereon, the wafer having a plurality of alignment targets, comprising:

a wafer retainer for retaining the wafer; and a clamp ring having a plurality of tabs, said clamp ring and said retainer being constructed for securing the wafer against said clamp ring by said retainer, each one of said plurality of tabs on said clamp ring being positioned to be located directly above a corresponding one of the plurality of alignment targets and having an area big enough to cover each of the corresponding one of the plurality of alignment targets for avoiding metal being deposited on each one the plurality of alignment targets during metal deposition of the wafer.

3. The holding apparatus as recited in claim 2, wherein said plurality of tabs are integral with said clamp ring.

4. The holding apparatus as recited in claim 2, wherein said clamp ring and said plurality of tabs are formed of metal.

5. The holding apparatus as recited in claim 4, wherein said clamp ring and said plurality of tabs are formed of titanium.

6. An apparatus for holding a semiconductor wafer during metal deposition thereon, the wafer having a plurality of alignment targets, comprising:

a wafer retainer for retaining the wafer, and a clamp ring having a plurality of tabs, said plurality of tabs being integral with said clamp ring, wherein said clamp ring and tabs are formed of metal, said clamp ring and said retainer being constructed for securing the wafer against said clamp ring by said retainer, each one of said plurality of tabs on said clamp ring being positioned to be located directly above a corresponding one of the plurality of alignment targets and having an area big enough to cover each of the corresponding one of the plurality of alignment targets for avoiding metal being deposited on each one the plurality of alignment targets during metal deposition of the wafer.

7. The apparatus as recited in claim 6, wherein said clamp ring and said plurality of tabs are formed of titanium.

8. A metal deposition system for use in depositing a selected metal onto a semiconductor wafer, the wafer having at least one topographical mark, comprising:

means for depositing a layer of the selected metal onto the wafer; and a holding apparatus for holding the wafer during said metal deposition, comprising:

a wafer retainer for retaining the wafer; and a clamp ring having at least one tab, said clamp ring and said retainer being constructed for securing the wafer against said clamp ring by said retainer, each one of said at least one tab on said clamp ring being positioned to be located directly above a corresponding one of the at least one topographical mark and having an area big enough to cover each of the corresponding one of the at least one topographical mark for avoiding metal being deposited on each one of the at least one topographical mark during metal deposition of the wafer.

9. A metal deposition system for use in depositing a selected metal onto a semiconductor wafer, the wafer having a plurality of alignment targets, comprising:

means for depositing a layer of the selected metal onto the wafer; and a holding apparatus for holding the wafer during said metal deposition, comprising:

a wafer retainer for retaining the wafer; and a clamp ring having a plurality of tabs, said clamp ring and said retainer being constructed for securing the wafer against said clamp ring by said retainer, each one of said plurality of tabs on said clamp ring being positioned to be located directly above a corresponding one or the plurality of alignment targets for avoiding metal being deposited on each one the plurality of alignment targets during metal deposition of the wafer.

10. The metal deposition system as recited in claim 9, wherein said plurality of tabs are integral with said clamp ring.

11. The metal deposition system as recited in claim 9, wherein said clamp ring and said plurality of tabs are formed of metal.

12. The metal deposition system as recited in claim 11, wherein said clamp ring and said plurality of tabs are formed of titanium.

13. The metal deposition system as recited in claim 9, wherein said metal deposition means uses a sputtering technique for deposition.

14. The metal deposition system as recited in claim 9, wherein said metal deposition means uses an evaporation technique for deposition.

15. A metal deposition system for use in depositing a selected metal onto a semiconductor wafer, the wafer having a plurality of alignment targets, comprising:

means for depositing a layer of the selected metal onto the wafer; and a holding apparatus for holding the wafer during the metal deposition, comprising:

a wafer retainer for retaining the wafer, and a clamp ring having a plurality of tabs, said plurality of tabs being integral with said clamp ring, wherein said clamp ring and tabs are formed of metal, said clamp ring and said retainer being constructed for securing the wafer against said clamp ring by said retainer, each one of said plurality of tabs on said clamp ring being positioned to be located directly above a corresponding one of the plurality of alignment targets and having an area big enough to cover each of the corresponding one of the plurality of alignment targets for avoiding metal being deposited on each one the plurality of alignment targets during metal deposition of the wafer.

16. The metal deposition system as recited in claim 15, wherein said clamp ring and said tabs are formed of titanium.

17. The metal deposition system as recited in claim 15, wherein said metal deposition means uses a sputtering technique for metal deposition.

18. The metal deposition system as recited in claim 15, wherein said metal deposition means uses an evaporation technique for metal deposition.

* * * * *